(12) United States Patent
Kawamura

(10) Patent No.: US 7,656,164 B2
(45) Date of Patent: Feb. 2, 2010

(54) METHOD OF VOLTAGE MEASUREMENT AND APPARATUS FOR SAME

(75) Inventor: Yoshihiro Kawamura, Shizuoka (JP)

(73) Assignee: Yazaki Corporation, Tokyo (JP)

( * ) Notice: Subject to any disclaimer, the term of this patent is extended or adjusted under 35 U.S.C. 154(b) by 388 days.

(21) Appl. No.: 11/446,374

(22) Filed: Jun. 5, 2006

(65) Prior Publication Data

US 2007/0024270 A1    Feb. 1, 2007

(30) Foreign Application Priority Data

Jul. 14, 2005   (JP) .............................. 2005-205625

(51) Int. Cl.
   *G01N 27/416*   (2006.01)
(52) U.S. Cl. .................. 324/434; 324/433; 320/116
(58) Field of Classification Search .............. 320/116; 324/433, 434
   See application file for complete search history.

(56) References Cited

U.S. PATENT DOCUMENTS 6,268,710 B1 * 7/2001 Koga ........................... 320/116
6,362,627 B1 * 3/2002 Shimamoto et al. ......... 324/434
6,639,408 B2 * 10/2003 Yudahira et al. ............. 324/434

FOREIGN PATENT DOCUMENTS

JP           11-248755       9/1999

* cited by examiner

*Primary Examiner*—Edward Tso
*Assistant Examiner*—Ramy Ramadan
(74) *Attorney, Agent, or Firm*—Kratz, Quintos & Hanson, LLP

(57) ABSTRACT

A method of voltage measurement, and an apparatus for the same, having an improved accuracy and low cost is provided. The apparatus includes: a charging unit for charging a capacitor; a measuring unit for measuring a charge of the capacitor; and a microcomputer for calculating a voltage of the voltage supply. The microcomputer includes a correction value calculating program. The correction value calculating program applies a voltage of a correction measurement voltage supply to the measuring unit, measures the voltage of the correction measurement voltage supply, and calculates a correction value from a difference between a measurement value and a theoretical value of the voltage of the correction measurement voltage supply. The microcomputer also includes a voltage measurement program for subtracting the correction value from the measurement value of the charge during the prescribed period of time of charge measurement and for calculating the voltage of the voltage supply.

9 Claims, 5 Drawing Sheets

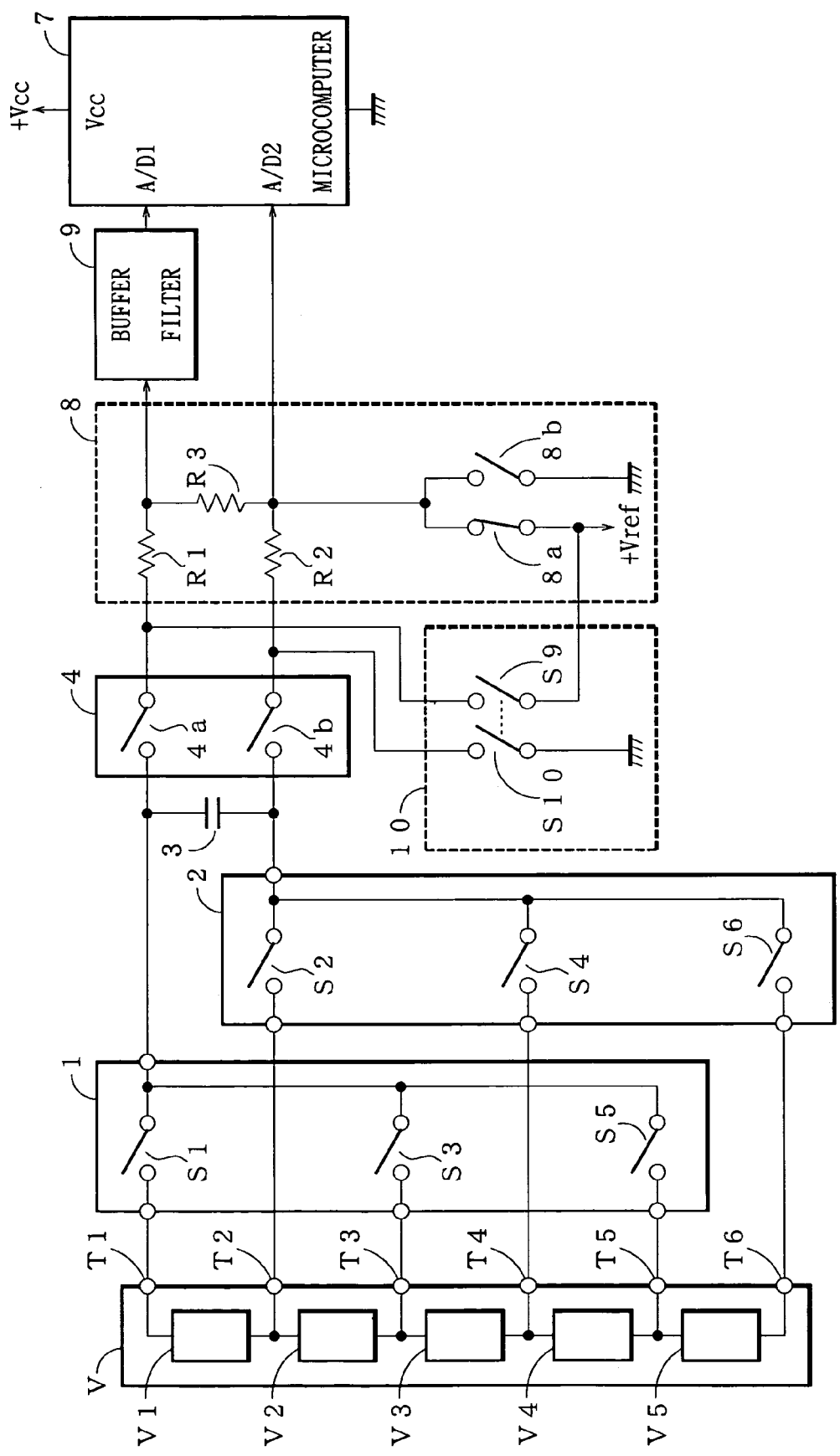
F I G. 4

METHOD OF VOLTAGE MEASUREMENT AND APPARATUS FOR SAME

BACKGROUND OF THE INVENTION

1. Field of the Invention

The present invention relates to a method of voltage measurement and an apparatus for the same and especially to a method and apparatus of voltage measurement of each voltage supply of a plurality of voltage supplies connected in series.

2. Description of the Related Art

An electric motor vehicle has a high voltage supply which is formed with a plurality of batteries (voltage supplies) connected in series. JP,H11-248755,A discloses a flying capacitor method for measuring voltage of each voltage supply of a plurality of batteries.

Each voltage supply is connected to a capacitor with a switch and disconnected each other with a multiplexer to measure a charge in the capacitor and to determine the voltage of the voltage supply.

A measurement is achieved by charging the capacitor with every each voltage supply and measuring the charge of the capacitor as shown in FIG. 8. The measurement of the voltage supply V1 includes a period of time of charging to charge the capacitor with the voltage supply V1 and a period of time of charge measurement to measure the charge of the capacitor for measuring the voltage of the voltage supply V1. The following measurement such as V2 also includes the period of time of charging and the period of time of charge measurement.

The conventional apparatus includes a polarity offset circuit for the charged capacitor and A/D converter for the charged voltage of the capacitor. Another conventional apparatus includes a voltage divider circuit and a buffer filter connected to a capacitor and an A/D converter for removing noise.

However, in the conventional apparatuses, the devices following to the capacitor have variations in quality, temperature characteristic, and degradation thereof so that the measurement accuracy is reduced. For a high-accuracy voltage measurement, high accurate and high reliable devices are required and resulting that the apparatus becomes expensive.

SUMMARY OF THE INVENTION

The present invention is to provide a method of voltage measurement with high accuracy and an apparatus for voltage measurement manufactured with low cost.

According to a first aspect of the present invention, a method of voltage measurement of a voltage supply includes the steps of: charging a capacitor with a charging unit for a prescribed period of time of charging; measuring a charge of the capacitor charged with a measuring unit for a prescribed period of time of charge measurement; and calculating a voltage of the voltage supply from a measurement value of the charge, wherein a voltage of a correction measurement voltage supply is supplied to the measuring unit and is measured during the prescribed period of time of charging, a correction value is calculated from a difference between a measurement value and a theoretical value of the voltage of the correction measurement voltage supply, and the correction value is subtracted from the measurement value of the charge during the prescribed period of time of charge measurement for calculating the voltage of the voltage supply.

According to a second aspect of the present invention, an apparatus for voltage measurement of a voltage supply includes: a charging unit for charging a capacitor for a prescribed period of time of charging; a measuring unit for measuring a charge of the capacitor charged during a prescribed period of time of charge measurement; and a microcomputer for calculating a voltage of the voltage supply from a measurement value of the charge, the microcomputer including: a correction value calculating program for applying a voltage of a correction measurement voltage supply to the measuring unit, measuring the voltage of the correction measurement voltage supply during the prescribed period of time of charging, and calculating a correction value from a difference between a measurement value and a theoretical value of the voltage of the correction measurement voltage supply, and a voltage measurement program for subtracting the correction value calculated at the correction value calculating program from the measurement value of the charge during the prescribed period of time of charge measurement and for calculating the voltage of the voltage supply.

According to a third aspect of the present invention, an apparatus for voltage measurement includes a capacitor; a first multiplexer for connecting the capacitor to a voltage sensing terminal of an odd number voltage supply in N+1 voltage terminals of N voltage supplies connected in series; a second multiplexer for connecting the capacitor to a voltage sensing terminal of an even number voltage supply in the N+1 voltage terminals; a reference voltage supply circuit connected between the capacitor and a microcomputer for supplying a reference voltage of voltage measurement during a prescribed period of time of charge measurement; a correction measurement circuit connected between the capacitor and the reference voltage supply circuit, for applying a voltage of a correction measurement voltage supply during a prescribed period of time of charging; and the microcomputer for calculating a voltage of the voltage supply from a measurement value of a charge of the capacitor, the microcomputer including: a correction value calculating program for applying a voltage of a correction measurement voltage supply to a measuring unit, measuring the voltage of the correction measurement voltage supply during the prescribed period of time of charging, and calculating a correction value from a difference between a measurement value and a theoretical value of the voltage of the correction measurement voltage supply, and a voltage measurement program for subtracting the correction value calculated at the correction value calculating program from the measurement value of the charge during the prescribed period of time of charge measurement and for calculating the voltage of the voltage supply.

Preferably, the reference voltage supply circuit supplies a middle value of voltage of a measurement full scale for a reference voltage of voltage measurement in the voltage measurement program.

Preferably, the reference voltage supply circuit has a first switch and a second switch for supplying a high voltage and a low voltage of the measurement full scale to the microcomputer as the reference voltages of voltage measurement, respectively and the correction measurement circuit supplies the high voltage of the measurement full scale of the reference voltage supply circuit to the microcomputer as a voltage of the correction measurement voltage supply so that the first switch is closed when the even number voltage supply is selected with the first and second multiplexers and charges the capacitor and the second switch is closed when the odd number voltage supply is selected with the first and second multiplexers and charges the capacitor with a reverse polarity compared with the even number voltage supply.

According to a fourth aspect of the present invention, an apparatus for voltage measurement includes: a capacitor; a first multiplexer for connecting the capacitor to a voltage sensing terminal of an odd number voltage supply in N+1 voltage terminals of N voltage supplies connected in series; a second multiplexer for connecting the capacitor to a voltage sensing terminal of an even number voltage supply in the N+1 voltage terminals; a reference voltage supply circuit connected between the capacitor and a microcomputer, for supplying a reference voltage of voltage measurement to the microcomputer; and the microcomputer for calculating a voltage of the voltage supply from a measurement value of a charge of the capacitor, the microcomputer including: a correction value calculating program for supplying a voltage of the reference voltage supply circuit to the microcomputer, measuring the voltage of the reference voltage supply circuit, and calculating a correction value from a difference between a measurement value and a theoretical value of the voltage of the reference voltage supply circuit during a prescribed period of time of charging, and a voltage measurement program for subtracting the correction value calculated at the correction value calculating program from the measurement value of the charge during a prescribed period of time of charge measurement and for calculating the voltage of the voltage supply.

Preferably, the reference voltage supply circuit has a divider circuit with a plurality of resistors for supplying a terminal voltage of the capacitor to the microcomputer, and a reference voltage supply for supplying the reference voltage of voltage measurement to the divider circuit.

Preferably, the divider circuit has the plurality of resistors having the same resistance.

BRIEF DESCRIPTION OF THE DRAWINGS

FIG. 4 is a diagram showing a configuration of a second embodiment of an apparatus for voltage measurement for achieving a method of the same of the present invention;

DETAILED DESCRIPTION OF THE PREFERRED EMBODIMENTS

Figure 1:
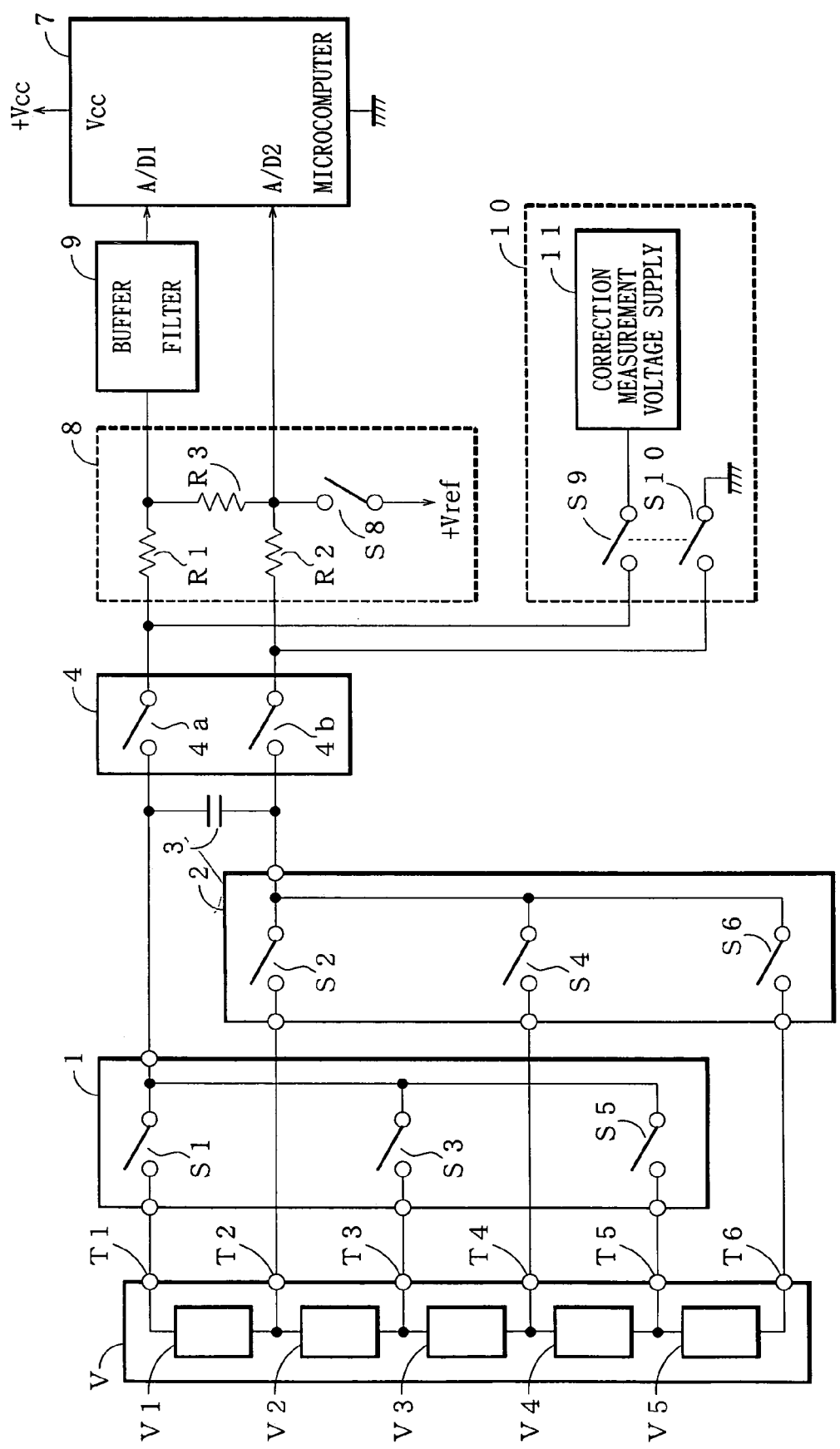
FIG. 1 is a diagram showing a configuration of a first embodiment of an apparatus for voltage measurement for achieving a method of the same of the present invention.

FIG. 1 shows a circuit of a first embodiment of an apparatus for voltage measurement of the present invention. The apparatus for voltage measurement is a flying capacitor method. The apparatus for voltage measurement includes a first multiplexer 1 and second multiplexer 2 connected to voltage sensing terminals T1-T6 of a high voltage power supply V, a bipolar capacitor 3, a sample switch 4, a microcomputer 7, a reference voltage supply circuit 8, a buffer filter 9, and a correction measurement circuit 10. The high voltage power supply V, the first and second multiplexers 1, 2, and the capacitor 3 forms a charging unit. The reference voltage supply circuit 8, the buffer filter 9 and the microcomputer 7 forms a measuring unit.

The high voltage power supply V has 5 voltage supplies of V1-V5 (N=5, N is a number of batteries connected in series in the high voltage power supply of the present embodiment). Each voltage supply of V1-V5 is connected to respective voltage sensing terminals of T1-T6 (N+1 is a number of the voltage sensing terminals).

The first multiplexer 1 has switches S1, S3, S5 connected to respective voltage sensing terminals T1, T3, T5. The second multiplexer 2 has switches S2, S4, S6 connected to respective voltage sensing terminals T2, T4, T6.

The switches S1, S3, S5 of the first multiplexer 1 are connected to a first terminal of the capacitor 3 and the switches S2, S4, S6 of the second multiplexer 2 are connected to a second terminal of the capacitor 3.

The sample switch 4 has a first switch 4a and a second switch 4b connected to the first and second terminals of the capacitor 3, respectively.

The microcomputer 7 has a voltage supply port Vcc, which accepts drive voltage from a power supply +Vcc, and input ports A/D1 and A/D2. The microcomputer 7 includes a correction value calculating program and voltage measurement program.

The reference voltage supply circuit 8 has resistors R1-R3, a switch S8, and a reference voltage supply +Vref. The resistors R1 and R2 are connected to the switches 4a and 4b, respectively. The resistor R3 is connected to the resistors R1 and R2. The resistors R1-R3 configures a divider circuit. The reference voltage supply +Vref is connected to a junction of the resistors R2 and R3 through the switch S8. The voltage of the reference voltage supply +Vref is set in a middle voltage of a measurement full scale value of the microcomputer 7. For example, the voltage is set to half of the drive voltage +Vcc of the microcomputer 7 or a value of +AVcc ($\leq$+Vcc). The setting voltage +AVcc/2 is set to be higher than each voltage of the voltage supplies V1-V5.

The buffer filter 9 is connected to a junction of the resistors R1, R3 and the input port A/D1 of the microcomputer 7. The buffer filter 9 removes noise which is input to the A/D1 port.

The correction measurement circuit 10 has switches S9, S10 and a correction measurement voltage supply 11. A terminal of the switch S9 is connected to the switch 4a and another terminal thereof is connected to the correction measurement voltage supply 11 and a terminal of the switch S10 is connected to the switch 4b and another terminal thereof is connected to ground.

In the following, a process of measuring voltage with flying capacitor method is explained. All switches S1-S6, 4a and 4b, S8, S9 and S10 of the first and second multiplexers 1 and 2, the sample switch 4, the reference voltage supply circuit 8, and the correction measurement circuit 10 are opened. The switches S1 and S2 of the first and second multiplexers 1 and 2 are closed. The voltage supply V1, voltage sensing terminal T1, switch S1, capacitor 3, switch S2 and voltage sensing terminal T2 forms a closed circuit. The voltage supply V1 charges the capacitor 3 so as that the first terminal of the capacitor 3 connected to the switch S1 becomes positive pole.

The switches S1 and S2 are opened and the switches 4a and 4b of the sample switch 4 and the switch S8 of the reference voltage supply circuit 8 are closed for a prescribed period of time. The charge of the capacitor 3, or the voltage of the voltage supply V1, is supplied to the first and second input ports A/D1 and A/D2 through the sample switch 4, the resistors R1-R3 and the buffer filter 9.

The voltage (+AVcc/2) of the reference voltage supply +Vref is supplied to the second input port A/D2 so that the first input port A/D1 is subjected to the voltage of the voltage supply V1 plus (+AVcc/2). The microcomputer 7 calculates an absolute value of a difference between the voltage at the first input port A/D1 and the second input port A/D2, that is |voltage at the first input port A/D1−voltage at the second input port A/D2|. The microcomputer 7 stores the calculated result as a measurement value of charge showing the voltage of the voltage supply V1. The voltages input to the first and second input ports A/D1 and A/D2 are converted from analog to digital for the calculation of the microcomputer.

When the switches S2 and S3 are closed, the voltage supply V2, voltage sensing terminal T2, switch S2, capacitor 3, switch S3 and voltage sensing terminal T3 form a closed circuit. In this case, the capacitor 3 charged has the positive pole at the terminal connected to the switch S2 contrast to the case of the voltage supply V1.

The switches S2 and S3 are opened. The switches 4a and 4b of the sample switch 4 and the switch S8 of the reference voltage supply circuit 8 are closed. The charge of the capacitor 3, or the voltage of the voltage supply V2 is applied to the first and second input ports A/D1 and A/D2 through the sample switch 4, the resistors R1-R3 and the buffer filter 9.

The voltage (+AVcc/2) of the reference voltage supply +Vref is supplied to the second input port A/D2 so that the first input port A/D1 is subjected to the voltage supply V2 plus (+AVcc/2) The microcomputer 7 calculates the absolute value of the difference between the voltages at the first input port A/D1 and the second input port A/D2, that is |voltage at the first input port A/D1−voltage at the second input port A/D2|. The microcomputer stores the calculated result as the measurement value of charge showing the voltage of the voltage supply V2.

The pairs of switches S3/S4, S4/S5, S5/S6 each are closed to charge the capacitor 3 for applying the voltages of V3, V4, V5 to the microcomputer 7.

Figure 2:
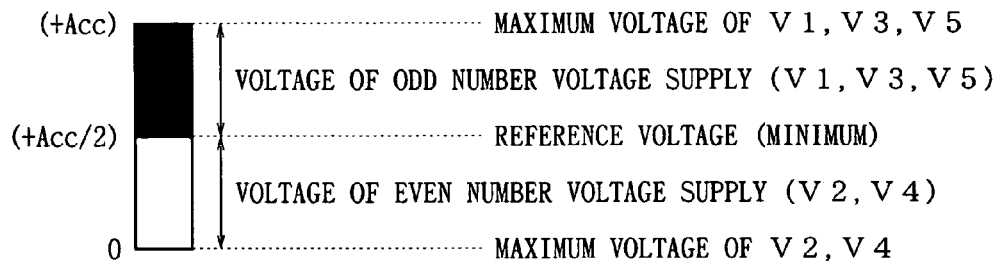
FIG. 2 is a diagram illustrating an operation of the apparatus of the voltage measurement of FIG. 1.

In the above measurement, the even number voltage supplies V2, V4 charge the capacitor 3 and are supplied to the microcomputer 7 with a reverse polarity compared with the odd number voltage supplies V1, V3, V5. When the voltage +AVcc/2 of the reference voltage supply +Vref applied to the second input port A/D2 is set to be a reference voltage, the voltage of the odd number voltage supplies V1, V3, V5 is converted into an upper half of the full scale, or (+AVcc/2) (min) to (+AVcc) (max), of A/D converter at the first input port A/D1 and the voltage of the even number voltage supplies V2, V4 is converted into an lower half of the full scale, or (+AVcc/2) (min) to (0) volt (max), of A/D converter at the first input port A/D1. FIG. 2 illustrates this conversion.

The apparatus of the present invention does not utilize a polarity change device as the conventional apparatus utilizes. When the half value of the measurement full scale is set to be (+AVcc/2), the voltage of the odd number voltage supplies V1, V3, V5 is detected in the range of (+AVcc/2) to (+AVcc) and the voltage of the even number voltage supplies V2, V4 is detected in the range of (+AVcc/2) to (0) volt. Accordingly, when (+Vcc) is 5 volts and (+AVcc) is equal to (+Vcc), the voltage of the odd number voltage supplies is detected at 2.5-5V and the voltage of the even number voltage supplies is detected at 2.5-0V.

Figure 3:
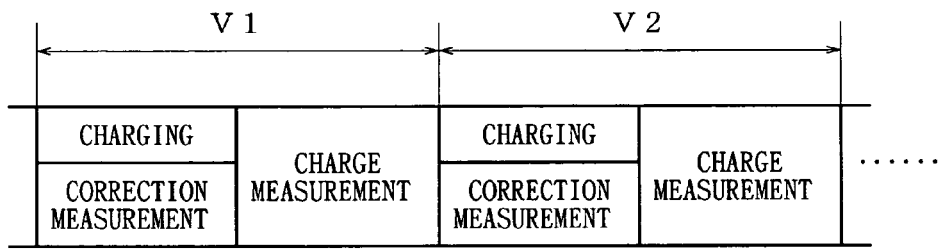
FIG. 3 is a diagram illustrating a period of time of measurement in the apparatus of the voltage measurement of FIG. 1.

The apparatus of voltage measurement of FIG. 1 has the correction measurement circuit 10 connected between the capacitor 3 and the measuring unit to correct quality variation, temperature characteristic and degradation of the devices thereof. The correction measurement is carried out during the period of time of charging the capacitor 3 as shown in FIG. 3.

The switches S9 and S10 of the correction measurement circuit 10 are closed during charging the capacitor 3. A voltage of the correction measurement voltage supply 11 is applied to the junction of the switch 4a and the resistor R1 and the junction of the switch 4b and the resistor R2. The switch S8 of the reference voltage supply circuit 8 is opened so that the reference voltage supply +Vref does not affect the correction measurement. The switches 4a and 4b of the sample switch 4 are also opened so that the reference voltage supply +Vref does not affect the charging of the capacitor 3.

The voltage of the correction measurement voltage supply 11 is divided by the resistors R1-R3 and supplied to the first and second input ports A/D1 and A/D2 through the buffer filter 9. The microcomputer 7 calculates an absolute value of a difference of the voltage between the first input port A/D1 and the second input port A/D2, that is |voltage at the first input port A/D1−voltage at the second input port A/D2|. The microcomputer 7 stores the calculated result as a measurement value of the voltage of the correction measurement voltage supply 11. The measurement value includes all variances of the reference voltage supply circuit 8, buffer filter 9 and A/D converters arranged between the capacitor 3 and the microcomputer 7.

The microcomputer 7 calculates a difference between the measurement value and a theoretical value of voltage of the correction measurement voltage supply 11 during a period of time of correction measurement. All variances, such as the quality, temperature characteristic and A/D converter error, of the devices arranged between the capacitor 3 and the microcomputer 7 are monitored with (the theoretical value of voltage of the correction measurement voltage supply 11)−(the measurement value)=a correction value   (1).

When the capacitor 3 is fully charged, the variances of the devices arranged between the high voltage power supply (V1, V2, . . . ) and the capacitor 3 do not affect the charging of the capacitor 3. The microcomputer 7 calculates a difference between the measurement value of charge of the capacitor 3 and the correction value of equation (1) with (the measurement value of charge of the capacitor 3)−(the correction value)=a corrected measurement value   (2).

The corrected measurement value is obtained by excluding the all possible variances, which reduce the measurement accuracy, so that the measurement accuracy is improved to a theoretical level.

The correction measurement of the measuring unit is carried out during charging the capacitor 3 so that the method of the present invention provides a fast, high accuracy and high reliable voltage measurement. The flying capacitor method has an advantage for noise and insulation.

FIG. 4 shows a circuit of a second embodiment of an apparatus of measuring a voltage of the present invention.

The apparatus of FIG. 4 shows almost the same configuration as FIG. 1 except a reference voltage supply circuit 8 and a correction measurement circuit 10. As shown in FIG. 4, the reference voltage supply circuit 8 has resistors R1-R3, a first switch 8a and a second switch 8b. The first switch 8a is connected between a junction of the resistors R2, R3 and a reference voltage supply +Vref, which provides a high voltage or the highest voltage of a measurement full scale of a microcomputer 7. The second switch 8b is connected between the junction of the resistors R2, R3 and the ground, which provides a low voltage or the lowest voltage of the measurement full scale of the microcomputer 7.

The voltage of the reference voltage supply +Vref is set to equal +Vcc of a drive voltage of the microcomputer 7 or at most the drive voltage +AVcc ($\leqq$+Vcc).

A correction measurement circuit 10 has switches S9 and S10. The switch S9 is connected between a junction of the switch 4a and the resistor R1, and the reference voltage supply +Vref. The reference voltage supply +Vref is the same function as the correction measurement voltage supply 11 of FIG. 1. The switch S10 is connected between a junction of a switch 4b and the resistor R2, and the ground.

In the following, a process of measuring a voltage with flying capacitor method is explained. All switches S1-S6 of a first and second multiplexers 1 and 2, 4a and 4b of a sample switch 4, S8a and S8b of the reference voltage supply circuit 8, S9 and S10 of the correction measurement circuit 10 are opened. The respective switches S1 and S2 of the first and second multiplexers 1 and 2 are closed. A voltage supply V1, voltage sensing terminal T1, switch S1, capacitor 3, switch S2 and voltage sensing terminal T2 form a closed circuit. The voltage of the voltage supply V1 charges the capacitor 3.

The switches S1 and S2 are opened and the second switch 8b of the reference voltage supply circuit 8 is closed. The switches 4a and 4b of the sample switch 4 are closed for a prescribed period of time. The charge of the capacitor 3, or the voltage of V1, is supplied to a first and second input ports A/D1 and A/D2 through the sample switch 4, the resistors R1-R3 and a buffer filter 9.

The ground voltage, or 0 volt, is supplied to the second input port A/D2 so that the first input port A/D1 is subjected to the voltage of V1. The microcomputer 7 calculates an absolute value of a difference between the voltage at the first input port A/D1 and the second input port A/D2, that is, |(the voltage at the first input port A/D1)−(the voltage at the second input port A/D2)|. The microcomputer stores the calculated result as a measurement value of the charge showing the voltage of the voltage supply V1.

When the switches S2 and S3 are closed, the voltage supply V2, voltage sensing terminal T2, switch S2, capacitor 3, switch S3 and voltage sensing terminal T3 form a closed circuit. The voltage of the voltage supply V2 charges the capacitor 3 with a reverse polarity compared with the case of the voltage supply V1.

The switches S2, S3 and the second switch 8b of the reference voltage supply circuit 8 are opened and the first switch 8a is closed. The switches 4a, 4b of the sample switch 4 are closed for a prescribed period of time to supply the charge of the capacitor 3, or the voltage of the voltage supply V2, to the first and second input ports A/D1, A/D2 through the resistors R1-R3.

The reference voltage supply +Vref (+AVcc) is supplied to the second input port A/D2 so that the first input port A/D1 is subjected to the voltage of the voltage supply V2 plus (+AVcc) The microcomputer 7 calculates an absolute value of the difference between the voltage at the first input port A/D1 and the second input port A/D2, that is |voltage at the first input port A/D1−voltage at the second input port A/D2|. The microcomputer 7 stores the calculated result as the measurement value of the charge showing the voltage of the voltage supply V2.

The pairs of switches S3/S4, S4/S5, S5/S6 each are closed to charge the capacitor 3 to apply the voltage of V3, V4, V5 to the microcomputer 7.

Figure 5:
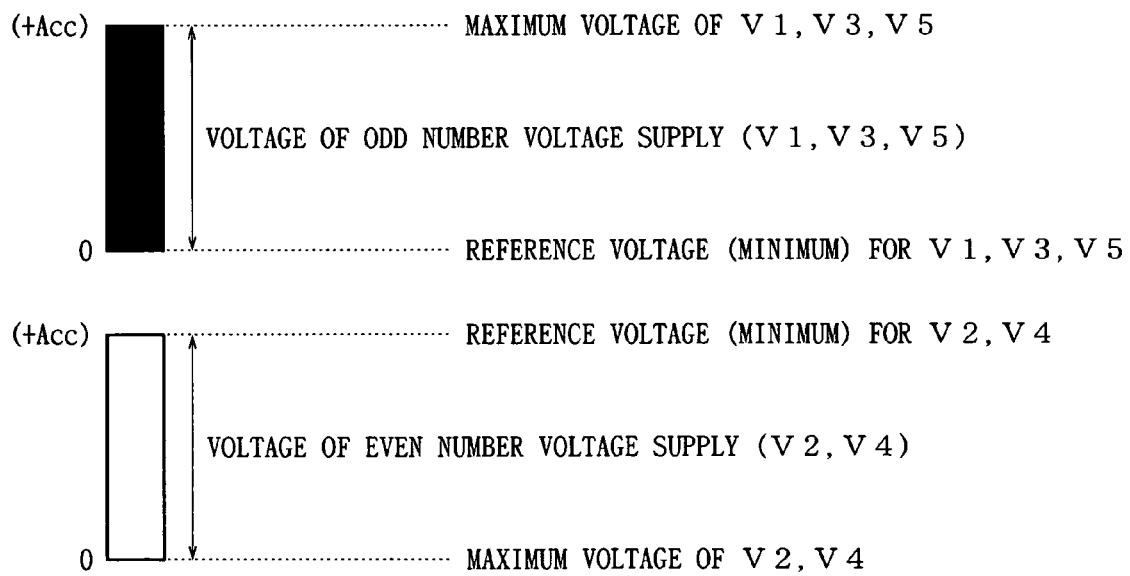
FIG. 5 is a diagram illustrating an operation of the apparatus of the voltage measurement of FIG. 4.

In the above measurement, the capacitor 3 has a reverse polarity for the odd number voltage supplies V1, V3, V5 compared with the even number voltage supplies V2, V4. When the voltage (+AVcc) or (0) volt of the reference voltage supply +Vref applied to the second input port A/D2 is set to be a reference voltage, the voltage of the odd number voltage supplies V1, V3, V5 is converted into a full scale, or (0) volt (min) to (+AVcc) (max) of A/D converter at the first input port A/D1 and the voltage of the even number voltage supplies V2, V4 is converted into a full scale, or (+AVcc) (min) to (0) volt (max) of A/D converter at the first input port A/D1. FIG. 5 illustrates this conversion.

The apparatus of the present invention does not utilize a polarity change device as the conventional apparatus utilizes. The reference voltage of the measurement full scale at the microcomputer 7 is set a maximum voltage (+AVcc) or a minimum voltage (0) volt. The voltage of the odd number voltage supplies V1, V3, V5 is detected in the range of (0) volt to (+AVcc) and the voltage of the even number voltage supplies V2, V4 is detected in the range of (+AVcc) to (0) volt. Accordingly, when +Vcc is 5 volts and (+AVcc) is equal to +Vcc, the voltage of the odd number voltage supply is detected at 0-5V and the voltage of the even number voltage supply is detected at 5-0V.

According to the second embodiment as shown in FIG. 4, the A/D full scale is not limited to ½ as in the first embodiment of FIG. 1 and the apparatus of the voltage measurement needs less devices than the conventional apparatus without reducing the accuracy and S/N.

In the apparatus for voltage measurement of FIG. 4, the correction measurement circuit 10 carries the correction measurement while charging the capacitor 3.

The switches S9 and S10 of the correction measurement circuit 10 are closed during charging the capacitor 3. The voltage of the reference voltage supply +Vref is applied to the junction of the switch 4a and the resistor R1 and a junction of the switch 4b and the resistor R2.

The voltage of the reference voltage supply +Vref is divided by the resistors R1-R3 and supplied to the first and second input ports A/D1 and A/D2 through the buffer filter 9. The microcomputer 7 calculates an absolute value of a difference of the voltage between the first input port A/D1 and the second input port A/D2, that is |the voltage at the first input port A/D1−the voltage at the second input port A/D2|. The microcomputer stores the calculated result as a measurement value of the voltage of the reference voltage supply +Vref. The measured value includes all variances of the reference voltage supply circuit 8, buffer filter 9 and A/D converter arranged between the capacitor 3 and the microcomputer 7.

The microcomputer 7 calculates a difference between the measurement value and a theoretical value of the voltage of the reference voltage supply +Vref during the period of time of correction measurement. All variances, such as quality, temperature characteristic and A/V converter error, of the devices arranged between the capacitor 3 and the microcomputer 7 are monitored with equation of (the theoretical value of the voltage of the reference
    voltage supply +Vref)−(the measurement value)
    =a correction value     (3).

The microcomputer 7 subtracts the correction value of equation (3) from the measurement value of charge of the capacitor 3. The second embodiment is also capable of obtaining the corrected measurement value by excluding the all possible factors which reduce the measurement accuracy.

Figure 6:
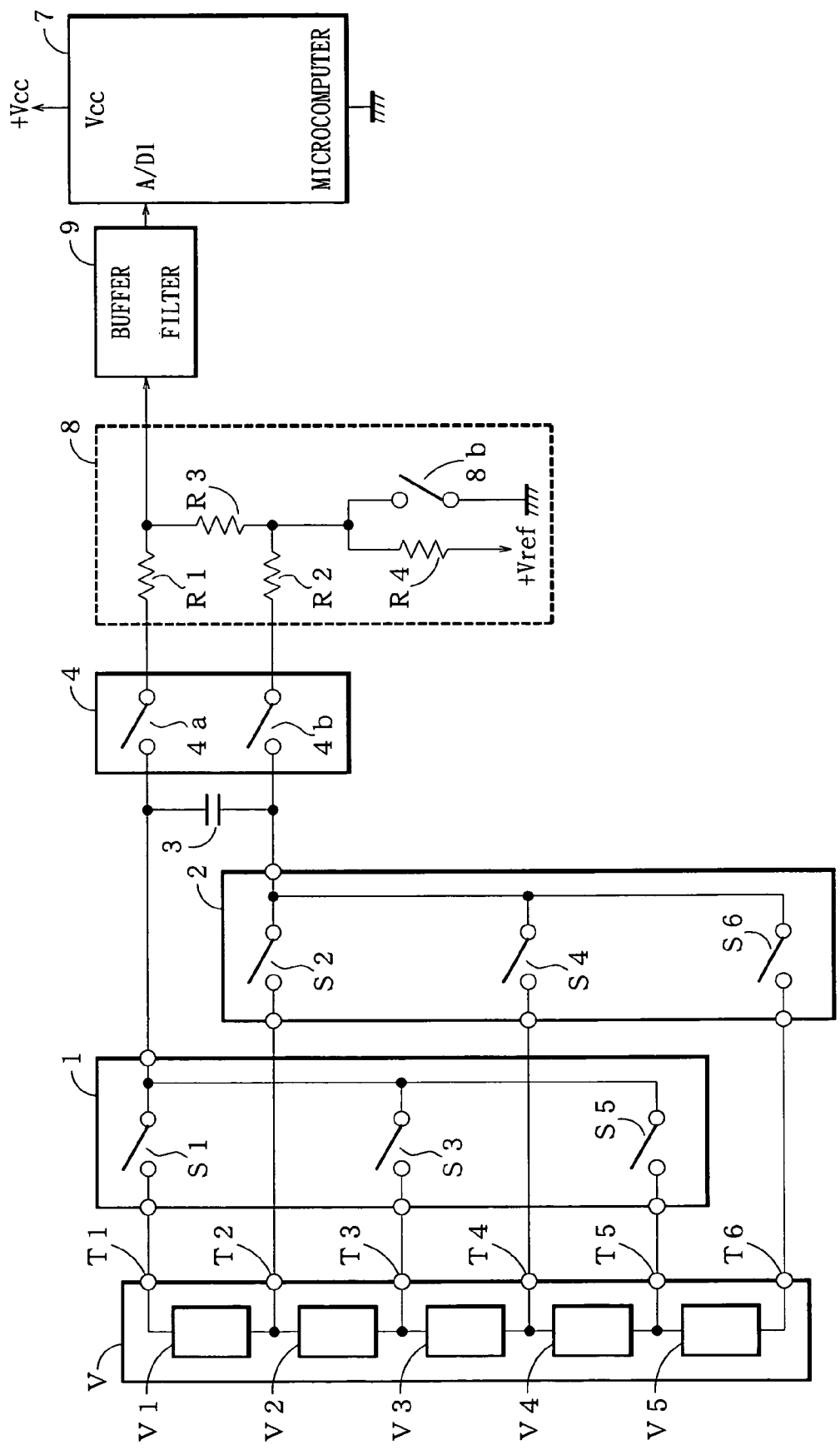
FIG. 6 is a diagram showing a configuration of a third embodiment of an apparatus for voltage measurement for achieving a method of the same of the present invention.

FIG. 6 shows a circuit of a third embodiment of an apparatus for voltage measurement of the present invention.

The apparatus for voltage measurement of FIG. 6 has the almost same configuration as that of FIG. 4 except a formation of a reference voltage circuit 8. The reference voltage supply +Vref functions also as a correction measurement voltage supply similarly to FIG. 4. In the reference voltage supply circuit 8 of FIG. 6, the first switch 8a of FIG. 4 is replaced with a resistor R4.

In the following, a process of measuring a voltage with flying capacitor method is explained. All switches S1-S6 of a first and second multiplexers 1 and 2, 4a and 4b of a sample switch 4, and a first switch 8b of the reference voltage supply circuit 8 are opened. The switches S1 and S2 of the first and second multiplexers 1 and 2, respectively are closed. A voltage supply V1, voltage sensing terminal T1, switch S1, capacitor 3, switch S2 and voltage sensing terminal T2 form a closed circuit. The voltage of the voltage supply V1 charges the capacitor 3.

The switches S1 and S2 are opened and the second switch 8b of the reference voltage supply circuit 8 is closed. The switches 4a and 4b of the sample switch 4 are closed for a prescribed period of time. The charge of the capacitor 3, or the voltage of the voltage supply V1, is supplied to the first input port A/D1 through the sample switch 4, resistors R1-R3 and a buffer filter 9.

The microcomputer calculates the voltage supplied to the first input port A/D1 and stores the calculated result as the value of the voltage supply V1.

When the switches S2 and S3 are closed, a voltage supply V2, voltage sensing terminal T2, switch S2, capacitor 3, switch S3 and voltage sensing terminal T3 form a closed circuit. The voltage of the voltage supply V2 charges the capacitor 3 with a reverse polarity compared with the case of the voltage supply V1.

The switches S2, S3 and the second switch 8b of the reference voltage supply circuit 8 are opened. The switches 4a, 4b of the sample switch 4 are closed for a prescribed period of time to supply the charge of the capacitor 3, or the voltage of the voltage supply V2, to the first input port A/D1 through the resistors R1-R3.

The voltage (+AVcc) of the reference voltage supply +Vref is supplied to a junction of the resistors R2 and R3 so that the first input port A/D1 is subjected to the voltage of the voltage supply V2 plus (+AVcc). The microcomputer 7 calculates the voltage supplied to the first input port A/D1 and the calculated result is assumed as the voltage of the voltage supply V2.

The pairs of switches S3/S4, S4/S5, S5/S6 each are closed to charge the capacitor 3 to apply the voltage of V3, V4, V5 to the microcomputer 7.

In the above measurement, the capacitor 3 has a reverse polarity for the odd number voltage supplies V1, V3, V5 compared with the even number voltage supplies V2, V4. When the voltage (+AVcc) or (0) volt of the reference voltage supply +Vref applied to the junction of the resistors R2 and R3 is set to be a reference voltage, the voltage of the odd number voltage supplies V1, V3, V5 is converted into a full scale, or (0) volt (min) to (+AVcc) (max) of A/D converter at the first input port A/D1 and the voltage of the even number voltage supplies V2, V4 is converted into the full scale, or (+AVcc) (min) to (0) volt (max) of A/D converter at the first input port A/D1. FIG. 5 illustrates the conversion similar to the apparatus of FIG. 4.

The apparatus of the third embodiment of the present invention does not utilize a polarity change device as the conventional apparatus utilizes. When the reference voltage is set to (+AVcc) or (0) volt, the voltage of the odd number voltage supplies V1, V3, V5 is detected in the range of (0) volt to (+AVcc) and the voltage of the even number voltage supplies V2, V4 is detected in the range of (+AVcc) to (0) volt. Accordingly, when +Vcc is 5 volts and (+AVcc) is equal to +Vcc, the voltage of the odd number voltage supply is detected at 0-5V and the voltage of the even number voltage supply is detected at 5-0v.

According to the third embodiment as shown in FIG. 6, the A/D full scale is not limited to ½ as in the first embodiment of FIG. 1 and the apparatus for the voltage measurement needs less devices than the conventional apparatus without reducing the accuracy and S/N.

In the apparatus for voltage measurement of FIG. 6, the correction measurement is carried out during charging the capacitor 3.

When the capacitor 3 is charged and the second switch 8b of the reference voltage supply circuit 8 is opened, the voltage of the reference voltage supply +Vref is applied to the junction of the resistors R2 and R3.

The voltage of the reference voltage supply +Vref is supplied to the first input port A/D1 through the buffer filter 9. The microcomputer 7 calculates the voltage supplied to the first input port A/D1 and stores the calculated result as a measurement value of the voltage of the reference voltage supply +Vref. The measurement value includes all variances of the reference voltage supply circuit 8, buffer filter 9 and A/D converter arranged between the capacitor 3 and the microcomputer 7.

As given in equation (3), the microcomputer 7 calculates a difference between the measurement value and a theoretical value of voltage of the reference voltage supply +Vref during a period of time of correction measurement. All variances, such as the quality, temperature characteristic and A/V converter error, of the devices arranged between the capacitor 3 and the microcomputer 7 are monitored.

The microcomputer 7 subtracts the correction value of equation (3) from the measurement value of charge of the capacitor 3. The third embodiment is also capable of obtaining the corrected measurement value by excluding the all possible factors which reduce the measurement accuracy.

The exemplary embodiments of the present invention are explained but the invention is not limited thereto and the modifications thereof are also possible.

In the embodiments described above, all switches of S1-S6 of the multiplexers 1 and 2, 4a and 4b of the sample switch 4, S8, 8a and 8b of the reference voltage supply circuit 8, S9 and S10 of the correction measurement circuit 10 can be opened/closed automatically with the CPU 7 or manually.

In the first embodiment, the voltage of the reference voltage supply +Vref is set to (+AVcc/2). The voltage can be set to any voltage as far as the voltage is a middle value of the full scale of the microcomputer 7 and each voltage of the voltage supplies V1-V5 is measurable.

In the second embodiment, the reference voltage supply circuit 8 is capable of supplying the maximum or minimum voltage of the measurement full scale of the microcomputer 7. The reference voltage supply circuit 8 may supply a respective close value of the maximum or minimum voltage.

In the embodiments described, the period of correction measurement is synchronous with the period of time of charging. The period of correction measurement can be set prior to the period of time of charging or between the period of time of charging and the period of time of charge measurement.

The embodiments of the present invention described utilize the flying capacitor method of the voltage measurement. Other methods such as direct measurement or non-multi method can be utilized.

The reference voltage supply circuit 8 has the three resistors R1-R3 to divide the voltage but the number of the resistor utilized can be varied with divisions of the voltage. In FIGS. 1, 4 and 6, the resistors R1-R3 is set to be R1=R2=2×R3 so as to provide a voltage ratio of 1:5 at R3. The terminal voltage of the capacitor 3 is divided into ⅕ and supplied to the input ports A/Q1 and A/D2.

The arrangement of resistors R1a, R1b for R1 and R2a, R2b for R2 is also possible so as to be R1a=R1b=R2a=R2b=R3. It is recommended that the five resistors have the same high accuracy of the divided voltage within an LSB (Least Significant Bit) of the input ports A/D1 and A/D2 of the microcomputer 7. Thereby, the variation of the divided voltage is reduced. All resistors have the same temperature characteristic so that the divided circuit is stable with respect to ambient temperature and the correction for the divided circuit is unnecessary.

Figure 7A:
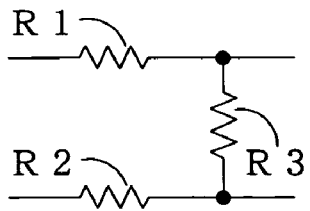
FIG. 7A is a circuit diagram of a divider circuit of the apparatus of the voltage measurement.

When the resistors R1-R3 of FIG. 7A have the same temperature characteristic, the ratio of the divided voltage at the resistor R3 is 1:5 but the variation of the divided voltage due to the temperature becomes 1:3, causing an error.

Figure 7B:
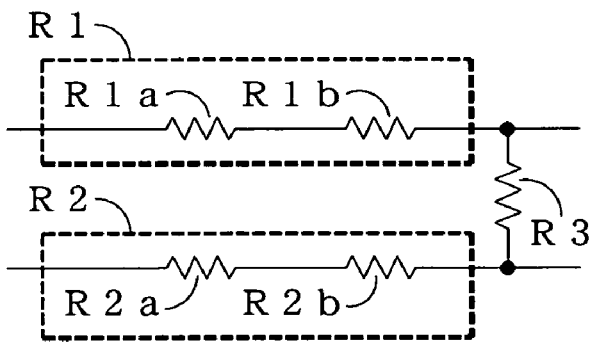
FIG. 7B is a circuit diagram of another divider circuit of the apparatus of the voltage measurement.
Figure 8:
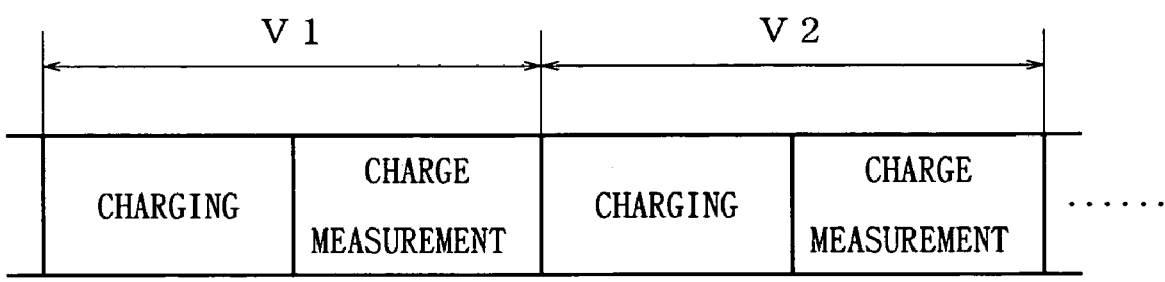
FIG. 8 is diagram illustrating a period of time of measurement of a conventional flying capacitor method of voltage measurement.

Contrary to FIG. 7A, the divider circuit of FIG. 7B has the same part number of resistors of R1a, R1b, R2a, R2b and R3. The dividing ratio and the variation thereof with respect to the temperature characteristic at the resistor R3 are both 1:5 so that the variation of the dividing ratio of the temperature characteristic is not generated. The utilization of the lower value of resistors R1a, R1b, R2a, R2b is suitable for obtaining the resistors having better accuracy.

The divider circuit formed with a plurality of the resistors having the same value of resistor is capable of adapting to any dividing ratio and eliminating the variation of the dividing ratio due to the temperature characteristic compared with the divider circuit formed with a small number of resistors having different value of resistors.

What is claimed is:

1. A method of voltage measurement of a voltage supply comprising the steps of:
    charging a capacitor with a charging unit for a prescribed period of time of charging;
    measuring a charge of the capacitor charged with a measuring unit for a prescribed period of time of charge measurement;
    supplying a reference voltage of voltage measurement from a reference voltage supply circuit connected between the capacitor and a microcomputer during the prescribed period of time of charge measurement;
    supplying a voltage of a correction measurement voltage supply from a correction measurement circuit connected between the capacitor and the reference voltage supply circuit during the prescribed period of time of charging; and
    calculating a voltage of the voltage supply from a measurement value of the charge, wherein
    the voltage of the correction measurement voltage supply is supplied to the measuring unit and is measured during the prescribed period of time of charging,
    a correction value is calculated from a difference between a measurement value and a theoretical value of the voltage of the correction measurement voltage supply, and
    the correction value is subtracted from the measurement value of the charge during the prescribed period of time of charge measurement for calculating the voltage of the voltage supply.

2. An apparatus for voltage measurement of a voltage supply comprising:
    a charging unit for charging a capacitor for a prescribed period of time of charging;
    a measuring unit for measuring a charge of the capacitor charged during a prescribed period of time of charge measurement;
    a microcomputer for calculating a voltage of the voltage supply from a measurement value of the charge;
    a reference voltage supply circuit connected between the capacitor and the microcomputer for supplying a reference voltage of voltage measurement during the prescribed period of time of charge measurement; and
    a correction measurement circuit connected between the capacitor and the reference voltage supply circuit, for supplying a voltage of a correction measurement voltage supply during the prescribed period of time of charging,
    said microcomputer including:
    a correction value calculating program for applying a voltage of a correction measurement voltage supply to the measuring unit, measuring the voltage of the correction measurement voltage supply during the prescribed period of time of charging, and calculating a correction value from a difference between a measurement value and a theoretical value of the voltage of the correction measurement voltage supply, and
    a voltage measurement program for subtracting the correction value calculated at the correction value calculating program from the measurement value of the charge during the prescribed period of time of charge measurement and for calculating the voltage of the voltage supply.

3. An apparatus for voltage measurement comprising:
    a capacitor;
    a first multiplexer for connecting the capacitor to a first voltage sensing terminal of an odd number voltage supply in N+1 voltage sensing terminals of N voltage supplies connected in series;
    a second multiplexer for connecting the capacitor to a second voltage sensing terminal of an even number voltage supply in the N+1 voltage sensing terminals;
    a reference voltage supply circuit connected between the capacitor and a microcomputer for supplying a reference voltage of voltage measurement during a prescribed period of time of charge measurement;
    a correction measurement circuit connected between the capacitor and the reference voltage supply circuit, for applying a voltage of a correction measurement voltage supply during a prescribed period of time of charging; and
    said microcomputer for calculating a voltage of the voltage supply from a measurement value of a charge of the capacitor,
    the microcomputer including:
    a correction value calculating program for applying the voltage of the correction measurement voltage supply to a measuring unit, measuring the voltage of the correction measurement voltage supply during the prescribed period of time of charging, and calculating a correction value from a difference between a measurement value and a theoretical value of the voltage of the correction measurement voltage supply, and
    a voltage measurement program for subtracting the correction value calculated at the correction value calculating program from the measurement value of the charge during the prescribed period of time of charge measurement and for calculating the voltage of the voltage supply.

4. The apparatus as claimed in claim 3, wherein said reference voltage supply circuit supplies a middle value of voltage of a measurement full scale for reference voltage of voltage measurement in the voltage measurement program.

5. The apparatus as claimed in claim 3, wherein the reference voltage supply circuit has a first switch and a second switch for supplying a high voltage and a low voltage of the measurement full scale to the microcomputer as the reference voltages of voltage measurement, respectively and the correction measurement circuit supplies the high voltage of the measurement full scale of the reference voltage supply circuit to the microcomputer as a voltage of the correction measurement voltage supply so that the first switch is closed when the even number voltage supply is selected with the first and second multiplexers and charges the capacitor and the second switch is closed when the odd number voltage supply is selected with the first and second multiplexers and charges the capacitor with a reverse polarity compared with the even number voltage supply.

6. An apparatus for voltage measurement comprising: a capacitor;
a first multiplexer for connecting the capacitor to a first voltage sensing terminal of an odd number voltage supply in N+1 voltage sensing terminals of N voltage supplies connected in series;
a second multiplexer for connecting the capacitor to a second voltage sensing terminal of an even number voltage supply in the N+1 voltage sensing terminals;
a reference voltage supply circuit connected between the capacitor and a microcomputer, for supplying a reference voltage of voltage measurement to the microcomputer,
said microcomputer for calculating a voltage of the voltage supply from a measurement value of a charge of the capacitor; and
a correction measurement circuit connected between the capacitor and the reference voltage supply circuit for supplying a voltage of a correction measurement voltage supply during a prescribed period of time of charging,
the microcomputer including:
a correction value calculating program for supplying a voltage of the reference voltage supply circuit to the microcomputer, measuring the voltage of the reference voltage supply circuit, and calculating a correction value from a difference between a measurement value and a theoretical value of the voltage of the reference voltage supply circuit during a prescribed period of time of charging, and
a voltage measurement program for subtracting the correction value calculated at the correction value calculating program from the measurement value of the charge during a prescribed period of time of charge measurement and for calculating the voltage of the voltage supply.

7. The apparatus as claimed in claim 3, wherein said reference voltage supply circuit has a divider circuit with a plurality of resistors for supplying a terminal voltage of the capacitor to the microcomputer, and a reference voltage supply for supplying the reference voltage of voltage measurement to the divider circuit.

8. The apparatus as claimed in claim 7, wherein said divider circuit has the plurality of resistors having the same resistance.

9. The apparatus as claimed in claim 6, wherein said reference voltage supply circuit has a divider circuit with a plurality of resistors for supplying a terminal voltage of the capacitor to the microcomputer, and a reference voltage supply for supplying the reference voltage of voltage measurement to the divider circuit.

* * * * *